(12) United States Patent
Spessot et al.

(10) Patent No.: US 10,439,036 B2
(45) Date of Patent: Oct. 8, 2019

(54) TRANSISTOR DEVICE WITH REDUCED HOT CARRIER INJECTION EFFECT

(71) Applicant: IMEC VZW, Leuven (BE)

(72) Inventors: Alessio Spessot, Leuven (BE); An De Keersgieter, Oud-Heverlee (BE); Naoto Horiguchi, Leuven (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/374,886

(22) Filed: Dec. 9, 2016

(65) Prior Publication Data

US 2017/0170289 A1     Jun. 15, 2017

(30) Foreign Application Priority Data

Dec. 11, 2015    (EP) ..................................... 15199618

(51) Int. Cl.
| | |
|---|---|
| *H01L 29/51* | (2006.01) |
| *H01L 29/423* | (2006.01) |
| *H01L 29/78* | (2006.01) |
| *H01L 29/06* | (2006.01) |
| *H01L 29/08* | (2006.01) |

(Continued)

(52) U.S. Cl.
CPC ........ *H01L 29/512* (2013.01); *H01L 29/0688* (2013.01); *H01L 29/0847* (2013.01);
(Continued)

(58) Field of Classification Search
CPC ... H01L 29/792–7926; H01L 29/66833; H01L 29/42324–42336;
(Continued)

(56) References Cited

U.S. PATENT DOCUMENTS 5,960,270 A * 9/1999 Misra .................. H01L 21/2257
257/E21.151
6,406,945 B1    6/2002 Lee et al.
(Continued)

FOREIGN PATENT DOCUMENTS

| JP | H11-003990 A | 1/1999 |
|---|---|---|
| WO | WO 00/49643 | 8/2000 |

OTHER PUBLICATIONS

European Search Report dated May 20, 2016 in European Patent Application No. 15199618.8; 9 pages.

*Primary Examiner* — Tucker J Wright
(74) *Attorney, Agent, or Firm* — Knobbe, Martens, Olson & Bear LLP (57) ABSTRACT

The disclosed technology generally relates to semiconductor devices, and more particularly to transistor devices such as metal-oxide-semiconductor (MOS) transistor devices. In one aspect, a transistor device comprises a channel region in a substrate partially delimited by a source and a drain junction at a main surface of the substrate. A first dielectric layer stack is arranged on the channel region, such that an orthogonal projection of the first dielectric layer stack on the main surface defining a first area is between and does not overlap the junctions and. A second dielectric layer stack is formed laterally adjacent to and in contact with the first dielectric layer stack, such that an orthogonal projection of the second dielectric layer stack overlaps the junction and defines a second area. A metal gate layer is formed on the first and second dielectric layer stacks, where an orthogonal projection of the metal gate layer on the main surface overlaps the first area and the second area. The first dielectric layer stack has a larger capacitance than the second dielectric layer stack.

22 Claims, 11 Drawing Sheets

(51) Int. Cl.
    *H01L 21/265*  (2006.01)
    *H01L 29/49*   (2006.01)
(52) U.S. Cl.
    CPC ...... *H01L 29/42368* (2013.01); *H01L 29/513* (2013.01); *H01L 29/517* (2013.01); *H01L 29/518* (2013.01); *H01L 29/7833* (2013.01); *H01L 21/265* (2013.01); *H01L 29/4966* (2013.01)
(58) Field of Classification Search
    CPC ... H01L 29/788–7889; H01L 21/28282; H01L 29/4234–42352; H01L 29/518; H01L 29/517; H01L 29/512; H01L 29/513; H01L 29/6653; H01L 29/0847; H01L 29/66553; H01L 29/6656; G11C 2216/06–10
    See application file for complete search history.

(56) References Cited

U.S. PATENT DOCUMENTS

| | | | |
|---|---|---|---|
| 6,709,934 | B2 | 3/2004 | Lee et al. |
| 7,442,977 | B2* | 10/2008 | Basceri ............. H01L 21/28194 257/296 |
| 2002/0100947 | A1* | 8/2002 | Lee .................. H01L 21/28194 257/412 |
| 2002/0142529 | A1 | 10/2002 | Matsuda et al. |
| 2007/0018238 | A1 | 1/2007 | Ono |
| 2012/0205751 | A1 | 8/2012 | Ohguro |
| 2014/0302646 | A1* | 10/2014 | Hirano ........... H01L 21/823456 438/197 |
| 2015/0123167 | A1 | 5/2015 | Ji et al. |
| 2015/0303204 | A1* | 10/2015 | Kwon ................ H01L 27/1157 257/324 |

* cited by examiner

TRANSISTOR DEVICE WITH REDUCED HOT CARRIER INJECTION EFFECT

CROSS-REFERENCE TO RELATED APPLICATIONS

This application claims foreign priority to European Patent Application No. EP15199618.8, filed on Dec. 11, 2015, the content of which is incorporated by reference herein in its entirety.

BACKGROUND

Field

The disclosed technology generally relates to semiconductor devices, and more particularly to transistor devices such as metal-oxide-semiconductor (MOS) transistor devices.

Description of the Related Technology

Hot carrier injection (HCI), also known as channel hot carrier (CHC) injection, is a phenomenon known in solid-state electronic devices, where electrons or holes gain sufficient kinetic energy within the channel to overcome a potential barrier of the gate dielectric. In MOS transistors, the energetic charge carriers can be physically injected into the gate dielectric and get trapped in the gate dielectric or the channel/gate dielectric, which can undesirably degrade the switching characteristics of the transistor. When the charge carriers are trapped permanently, the degradation in the switching characteristics can be permanent. The hot-carrier injection is one of the mechanisms that negatively impacts the reliability of solid-state devices, such as MOS transistors.

This phenomena has been known for decades, as well as some proposed solutions, including some fabrication process-based solutions (e.g., smoothening of the junction profile by doping adjustment) and design solutions (e.g. reduction of applied field seen by devices, according to safe operating conditions).

However, as physical scaling continues for transistors, known solutions for mitigating the hot carrier injection may not be sufficient. Thus, there exists a need in the relevant industry for novel transistor devices with reduced CHC effects in scaled devices.

SUMMARY OF CERTAIN INVENTIVE ASPECTS

It is an aim of the present disclosure to provide a transistor device, e.g. a MOS transistor device, with reduced hot carrier injection effect.

This aim is achieved according to the disclosure with the transistor device showing the technical characteristics of the first independent claim.

In embodiments according to the present disclosure, a transistor device is disclosed comprising a channel region in a substrate partially delimited by a source and a drain junction at a main surface of the substrate; a first dielectric layer stack arranged on the channel region on the main surface of the substrate, the orthogonal projection of the first dielectric layer stack on the main surface being in between and not covering the junctions and defining a first area; a second dielectric layer stack laterally adjacent to and in physical contact with the first dielectric layer stack, the orthogonal projection of the second dielectric layer stack on the main surface comprising the junction and defining a second area; a metal gate layer on top of the first and the second dielectric layer stack, the orthogonal projection of the metal gate layer on the main surface covering at least the first area and the second area; wherein the capacitance of the first dielectric layer stack is larger than the capacitance of the second dielectric layer stack.

The respective capacitances are typically defined between the metal gate layer and the channel region.

According to preferred embodiments, the capacitance of the first dielectric stack is at least 10%, more preferable at least 20%, more preferably at least 30%, more preferably at least 50%, more preferable at least 100%, more preferable at least 200% larger than in the second dielectric layer stack.

It is an advantage embodiments of the present disclosure that the electric field in the junction area, e.g. on top of the junction, can be reduced, reducing the occurrence of HCI, while at the same time maintaining good channel control from the gate. It is believed that the best trade-off between potential increase in gate leakage, possible detrimental reduction in performance and reduction of the coupling on top of the overlap region can be achieved.

The skilled person will recognize that the capacitances of the first and second dielectric layer stack (here present in between a common gate metal layer and a common channel region) are determined by the dielectric constants (also known as k-values) and thicknesses of the dielectric layers in the respective stacks. Below, various embodiments of the present disclosure are described.

According to preferred embodiments, the first dielectric layer stack comprises a first dielectric layer comprising a silicon oxide $SiO_x$ and/or $SiO_xN_y$ (including $SiO_2$ and $SiN_x$), and has a dielectric constant k1 and a second, preferably high-k, dielectric layer having a dielectric constant k4 on the silicon oxide layer, with k4>k1.

In the art, a low k material or layer is a layer or material having a dielectric constant k which is lower than the dielectric constant of $SiO_2$ (3.9), and a high k material or layer is a material or layer which has a dielectric constant k which is larger than the dielectric constant of $SiO_2$.

Examples of low k materials are for instance Fluorine-doped silicon dioxide (k of about 3.5), Carbon-doped silicon dioxide (k of about 3), Porous silicon dioxide (k of about 2), Porous carbon-doped silicon dioxide (k<3), and other materials known to the skilled person.

Examples of high k materials are for instance $HfO_2$ (k of for instance within the range of 15 to 40), doped $HfO_2$ (15<k<45), e.g., $Hf_xSi_yO_2$, $Hf_xC_yO_2$, $Hf_xTi_yO_2$, $Hf_xCe_yO_2$, $Hf_xSn_yO_2$, $Hf_xGe_yO_2$, and $Hf_xZrO_2$ (k of about 24.7), $TaO_5$ (k of about 27), and other materials known to the skilled person. According to preferred embodiments, the high-k materials used as the upper or second layer in the first dielectric layers stack has a k-value larger than 15.

According to preferred embodiments of a first type, the second dielectric layer stack comprises a single layer being a dielectric layer having a dielectric constant k23, the thickness of which corresponds to, or is matched or substantially equal to, the thickness of the first layer of the first dielectric layer stack.

According to preferred embodiments of a first type, the second dielectric layer stack comprises a single layer being a dielectric layer having a dielectric constant k23, the thickness of which corresponds to, or is matched or substantially equal to, the thickness of the first dielectric layer stack.

According to preferred embodiments of a first type, the second dielectric layer stack comprises a single layer being a dielectric layer having a dielectric constant k23, the thickness of which is in between the thickness of the first layer of the first dielectric layer stack and the thickness of the first dielectric layer stack. It is an advantage that a larger process flexibility exists for manufacturing these devices.

According to preferred embodiments of a first type, the second dielectric layer stack comprises a single layer being a dielectric layer having a dielectric constant k23, the thickness of which is larger than the thickness of the first dielectric layer stack. It is an advantage that a larger process flexibility exists for manufacturing these devices.

According to preferred embodiments, $k1<=k23<k4$.

For instance, with $k1=k(SiO2)<k23<k4=k(HfO2)$, suitable materials (having intermediate k value in between k1 and k4) are for instance silicon monoxide (SiO, K of about 5.0), silicon dioxide (SiO2, K of about 3.9), silicon nitride (SiO3N4, K of about 6), alkali halides (rubidium bromide, RbBr, K of about 4.7), lithium fluoride, LiF, K of about 9.2), and other materials known to the skilled person.

It is an advantage of embodiments having single dielectric layer in the second dielectric layer stack is more easy to manufacture, as compared to embodiment of the second type described below.

According to preferred embodiments of a second type, the second dielectric layer stack comprises a first dielectric layer having a dielectric constant k2 and a second dielectric layer having a dielectric constant k3 on top of the first dielectric layer.

According to preferred embodiments of a second type, $k2<k3$.

According to preferred embodiments of a second type, $k1>k2$, and $k2<k3<k4$.

According to alternative preferred embodiments of a second type, $k1<k2<k3<k4$.

According to still alternative preferred embodiments of a second type, $k1<k3<k2<k4$.

According to preferred embodiments of a second type, the first dielectric layer of the second dielectric layer stack comprises silicon oxide and/or SiOxNy (including SiOx and SiNx).

According to preferred embodiments of a second type, the first dielectric layer of the second dielectric layer stack comprises the same material as the material of the first layer of the first layer stack, and further comprises atoms which cause $k2<k1$. These embodiments may be the result of a process wherein a single first layer is provided, common for the first and second dielectric layer stack, and whereby the layer is implanted with atoms/ions, resulting in a lowering of the dielectric constant in the implanted region. Instead of implantation, also a diffusion process can be used, resulting in a similar structure. It is an advantage that the production process for devices of this embodiment is simplified as a single layer is forming the first layer of the first and second dielectric layer stack.

According to preferred embodiments of a second type, the first dielectric layer of the second dielectric layer stack has a thickness equal to the first layer of the first dielectric layer stack, and the second dielectric layer of the second dielectric layer stack has a thickness which is smaller or equal than the thickness of the high-k layer of the first dielectric layer stack.

According to preferred embodiments of a second type, the second dielectric layer stack is provided laterally adjacent and in physical contact with the first dielectric layer stack, on both sides of the first dielectric layer stack.

Features and advantages disclosed for one of the above aspects of the present disclosure are hereby also implicitly disclosed for the other aspects, mutatis mutandis, as the skilled person will recognize.

Certain objects and advantages of various inventive aspects have been described herein above. It is understood that this summary is merely an example and is not intended to limit the scope of the disclosure. The disclosure, both as to organization and method of operation, together with features and advantages thereof, may best be understood by reference to the following detailed description when read in conjunction with the accompanying drawings.

BRIEF DESCRIPTION OF THE DRAWINGS

The disclosure will be further elucidated by means of the following description and the appended figures.

DETAILED DESCRIPTION OF CERTAIN ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as example manners in which the disclosure may be implemented rather than as limiting the scope of the disclosure.

Figure 1:
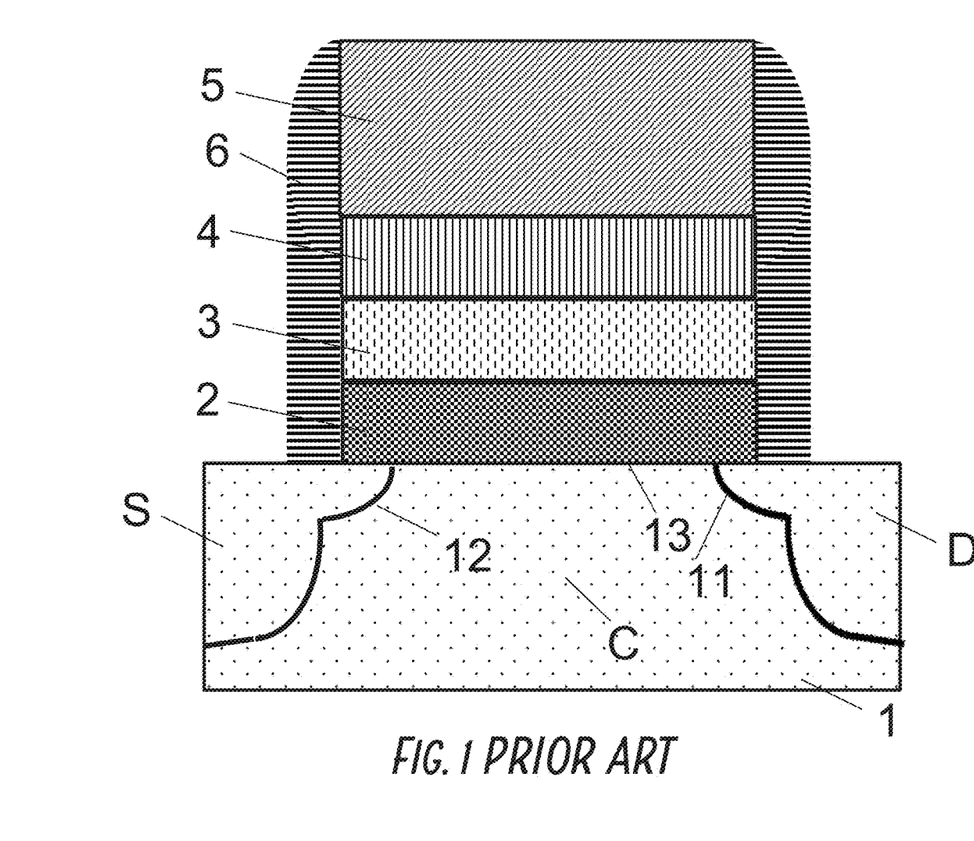
FIG. 1 illustrates a state of the art MOS transistor device.

FIG. 1 illustrates a state of the art MOS transistor device. In a silicon substrate 1, a channel region C is defined, which is delimited by a source S and a drain D region, forming respective junctions 11 and 12 therewith. On top of the channel C, on a main surface 13 of the substrate 1, a gate dielectric layer stack is provided, e.g. a silicon oxide (SiO2) layer 2 and a high-k dielectric layer 3 on top of the silicon oxide layer 2. On top of the dielectric layer stack, a metal gate layer 4 and poly-silicon layer 5 is provided. The gate stack is laterally defined by spacer structures 6. These state of the art MOS transistor devices often suffer from the HCI effect.

According to various embodiments described herein, a transistor device has a channel region formed or defined in a substrate 1 between a source junction and a drain junction formed at a main surface of the substrate. In various embodiments, the source junction 12 and the drain junction 11 are junctions formed between lightly doped drain (LDD) regions or extension regions of the respective source and drain and the substrate 1.

As described herein, the extension regions, sometimes referred to as lightly doped drain (LDD) regions, refer to implanted regions that are aimed at, among other things, reducing the intensity of electric field at the PN junctions formed between the source/drain and the substrate, and/or reducing parasitic capacitances. The substrate or channel regions below the gate edges are implanted with LDD or extension implants, whose doping concentration is lower than the main source and drain regions.

According to various embodiments, the transistor has a first dielectric layer stack formed on the channel region, where a projection of the first dielectric layer stack on the substrate does not cover the source and drain junctions, the projection defining a first area. The transistor additionally includes a second dielectric layer stack laterally adjacent to and in contact with the first dielectric layer stack, wherein a projection of the second dielectric layer stack on the substrate defines a second area. A metal gate layer formed on the first and second dielectric layer stacks, where a projection of the metal gate layer on the substrate covers at least the first area and the second area.

According to various embodiments, the areas and dielectric constants of the first and second dielectric layer stacks are such that the capacitance of the first dielectric layer stack is larger than the capacitance of the second dielectric layer stack, and hence the first dielectric layer stack serves as a main gate dielectric stack for primarily controlling the channel of the transistor.

According to various embodiments, the transistor further has spacers formed on its lateral sides, which may be formed of, e.g., silicon nitride. The spacers contact each of lateral sides of the metal gate layer, where a second dielectric layer stack is laterally interposed between the first dielectric layer stack and the spacer on the lateral sides of the transistor. As a result, the spacer does not contact the first dielectric layer stack.

Figure 2:
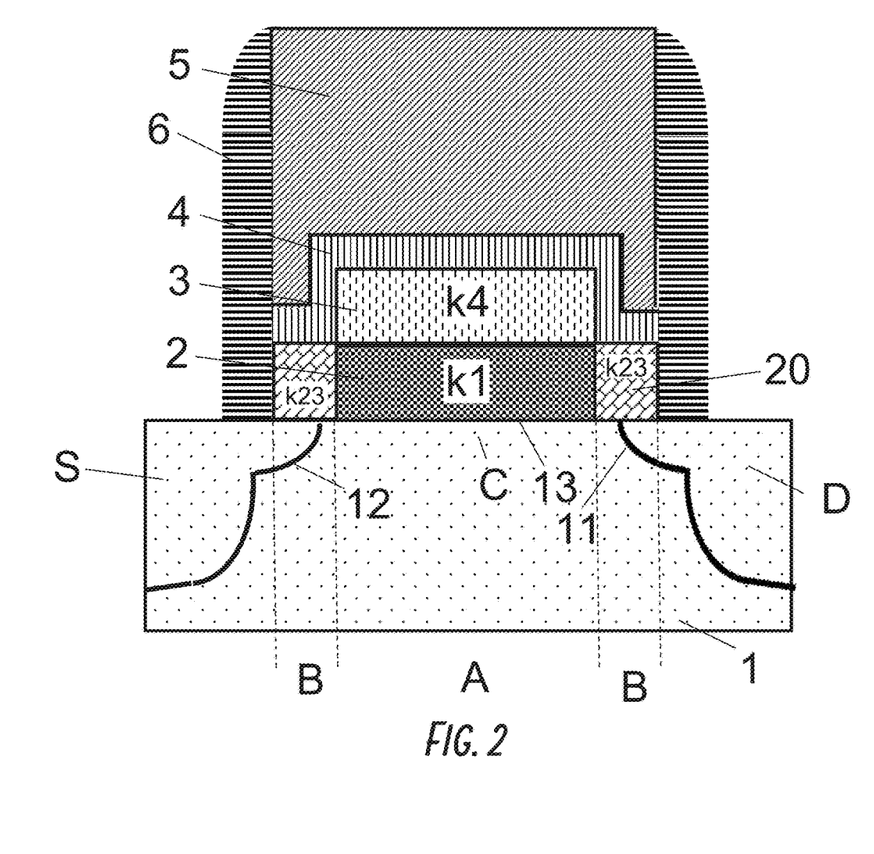
FIGS. 2 to 8 illustrate transistor devices according to a first to seventh embodiments according to the present disclosure.

FIG. 2 illustrates a transistor device according to a first embodiment of the present disclosure. In a silicon substrate 1, a channel region C is defined, which is delimited by a source S and a drain D region, forming respective junctions 11 and 12 therewith.

The MOS transistor device comprises a channel region C in a substrate 1 partially delimited by a source junction 12 and a drain junction 11 at a main surface 13 (the upper surface) of the substrate 1. The transistor device has a first dielectric layer stack 2,3 arranged on the channel region C on the main surface 13 of the substrate 1, where an orthogonal projection of the first dielectric layer stack on the main surface 13 is between and not extending to overlap or cover the junctions 11, 12, and defines a first area A. The transistor device additionally has a second dielectric layer stack 20 laterally adjacent to and in physical contact with the first dielectric layer stack 2,3, where an orthogonal projection of the second dielectric layer stack 20 on the main surface 13 covers or overlaps the junction 11, 12, and defines a second area B. A metal gate layer 4 is formed on top of the first and the second dielectric layer stack, wherein an orthogonal projection of the metal gate layer 4 on the main surface covering at least the first area A and the second area B. The capacitance of the first dielectric layer stack is larger than the capacitance of the second dielectric layer stack.

In the embodiment depicted in FIG. 2, but also in the further embodiments which will be described in relation with FIG. 3 to FIG. 8, the first dielectric layer stack comprises a first layer 2 comprising a silicon oxide $SiO_2$ and/or $SiO_x$ and/or SiON, and has a dielectric constant k1 and a second, high-k dielectric layer 3 having a dielectric constant k4 on the silicon oxide layer 2, with k4>k1.

In the illustrated embodiment, the second dielectric layer stack is formed of a single layer 20 being a dielectric layer having a dielectric constant k23. The thickness of the single dielectric layer 20, and thus of the second dielectric layer stack, is matched, about equal or substantially equal, e.g., within about 10% or 5%, to the thickness of the first layer 2 of the first dielectric layer stack. The metal gate layer 4 is provided on both the first and the second dielectric layer stacks.

Examples of physical dimensions for various embodiments of the transistor device disclosed herein include the following (ranges being representative examples without limitation): The first layer 2 is formed of a silicon oxide (e.g., $SiO_2$) having a thickness (common to all the cases) between about 0.5 nm and about 2.0 nm for low voltage (VDD<2.75V) applications, or between about 2 nm and about 5 nm for I/O oriented applications (e.g., applications where VDD~2.75-3V), or greater than 5 nm for applications where VDD>=3V The second, high-k dielectric layer 3 has a thickness between about 1 nm and about 10 nm, between about 1.5 nm and about 5 nm, between about 1.5 nm and about 3 nm, for instance about 2 nm. In various embodiments, the second, high-k dielectric layer 3 is formed of or comprises a high-k material, e.g., $HfO_2$, which can be doped. The metal gate 4 can be formed of or include metallic materials, e.g., TiN, TaN and TiAlN, and has a thickness in the range between (about) 2 to (about) 10 nm. The spacers 6 can have a thickness greater than about 5 nm, and can depend on the application. The spacer thickness can be, e.g., between about 5 nm and about 20 nm for low voltage (e.g., VDD<2.75V) applications, between about 20 nm and about 40 nm for higher voltage (e.g., VDD>2.75V) applications. The lateral dimension of the second area in the channel length direction, on top of the junction, can be between about 5 nm and about 10 nm, or between about ½ and about ⅛ of the gate length, between about ⅓ and about ⅕ of the gate length, for instance about ¼ or ¼ of the gate length.

The lateral dimension of the first area in the channel length direction can depend on the technology node. For example, the lateral dimension can be about 15-20 nm for advanced ultra-scaled technology nodes (VD<1V) up to less scaled nodes (e.g., where Lgate is greater than about 50 nm, and smaller than about 200 nm, or smaller than 1 µm, or smaller than 10 µm)

The poly-silicon layer 5 of the gate stack can have a thickness greater than about 50 nm. (Alternatively, the gate stack can comprise a filling metal material (e.g. W) instead of the poly-silicon layer 5 on the metal gate layer 4.

For various embodiments described herein, the capacitance of the first dielectric layer stack is advantageously rendered to have a greater value than the capacitance of the second dielectric layer stack, by engineering the thicknesses and k-values of the dielectric layers in the respective stacks.

Figure 3:
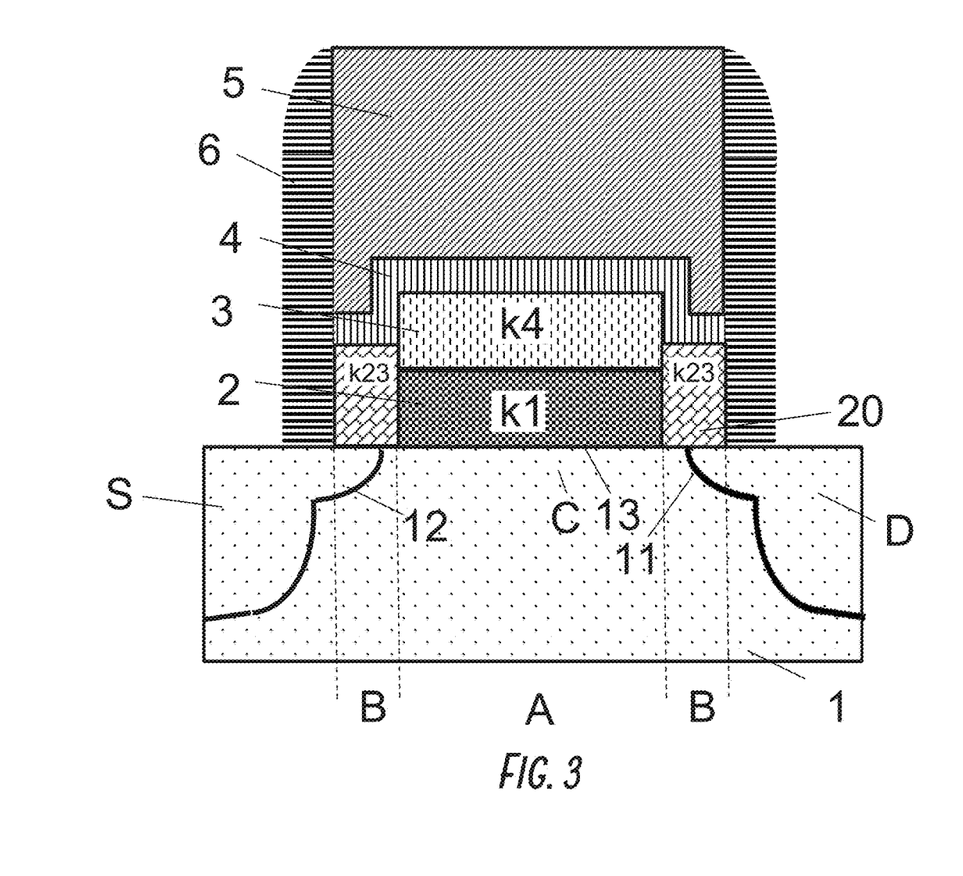

FIG. 3 illustrates a transistor device according to a second embodiment of the present disclosure. The second embodiment described with respect to FIG. 3 is similar to the first embodiment described above with respect to FIG. 2, except that the thickness of the second dielectric stack, formed as a single dielectric layer 20, is between the thickness of the first layer 2 of the first dielectric layer stack and the thickness of the first dielectric layer stack 2,3. This provides a better leakage current control than in the embodiment described in relation with FIG. 2.

Figure 4:
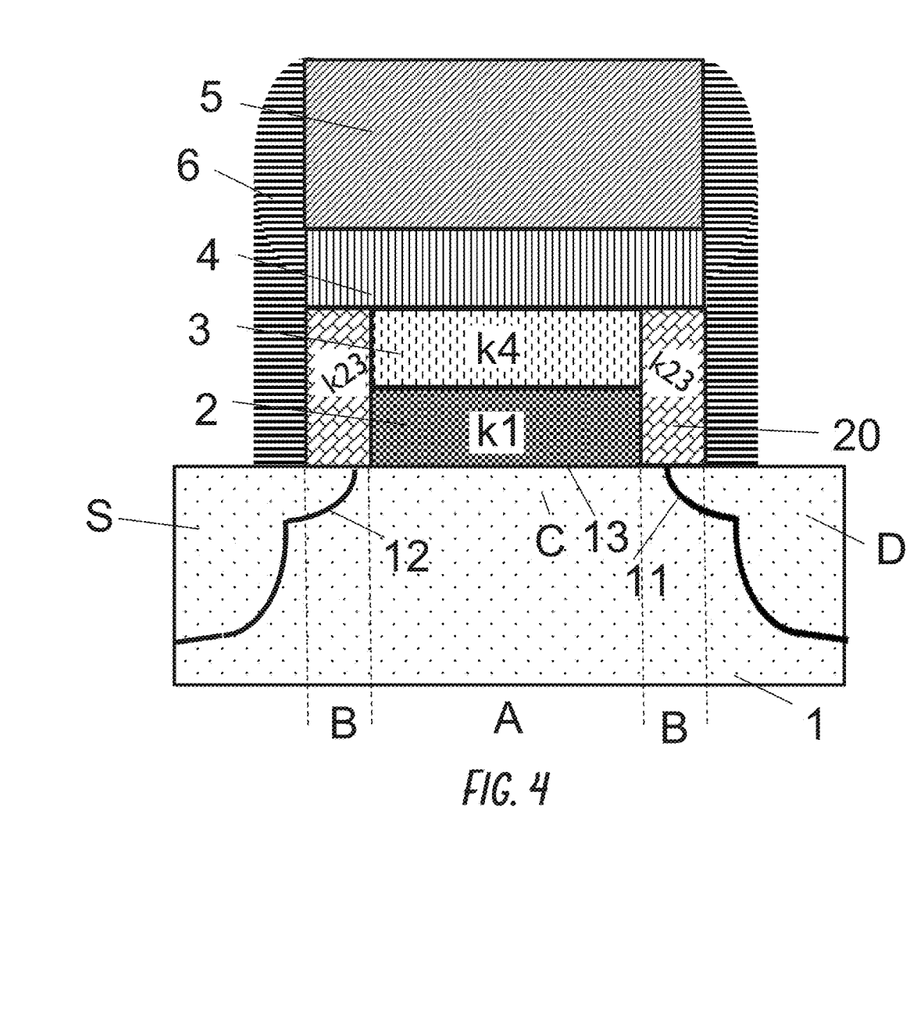

FIG. 4 illustrates a transistor device according to a third embodiment of the present disclosure. The third embodiment described with respect to FIG. 4 is similar to the first and second embodiments described above with respect to FIGS. 2 and 3, except that the thickness of the second dielectric stack, formed as a single dielectric layer 20, is matched, about equal or substantially equal, e.g., within about 10% or 5%, to the thickness of the first dielectric layer stack 2,3. It is an advantage over the embodiments described in relation to FIG. 2 and FIG. 3 that when manufacturing the device, an optimal control of metal gate deposition exists, as there is less or no potential non-uniformity related to the Metal Gate fabrication itself.

Figure 5:
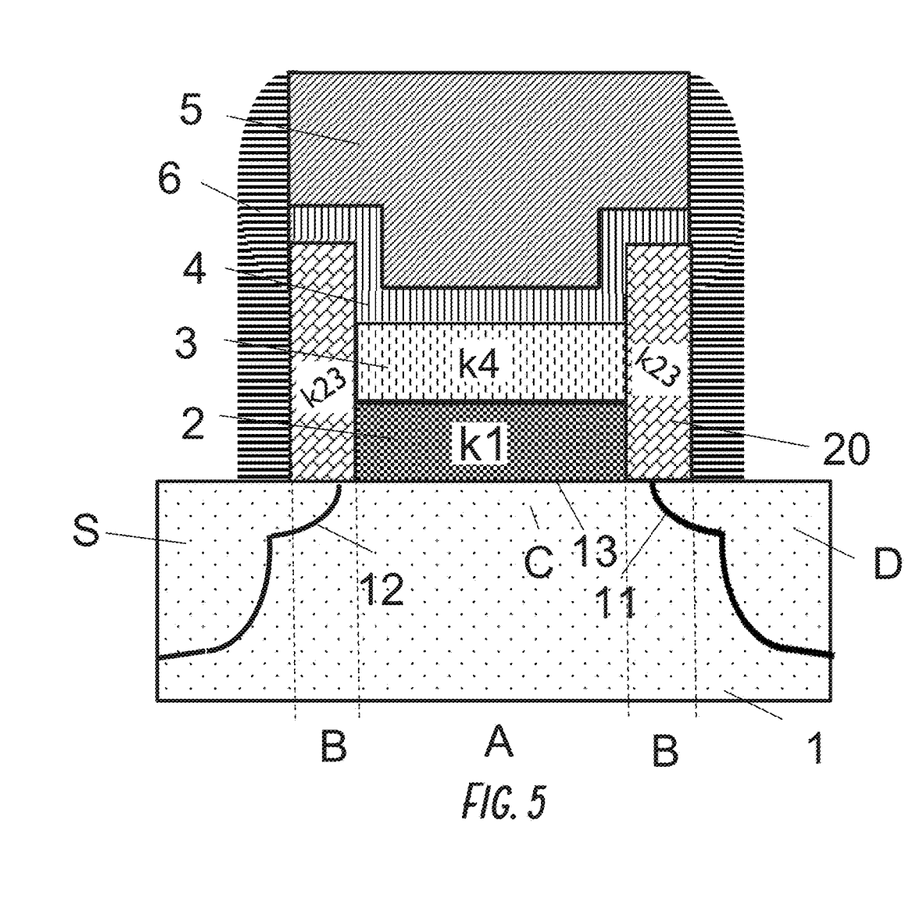

FIG. 5 illustrates a transistor device according to a fourth embodiment of the present disclosure. The fourth embodiment described with respect to FIG. 5 is similar as the first, second and third embodiments described above with respect to FIGS. 2-4, except that the thickness of the second dielectric stack, formed as a single dielectric layer 20, is greater than the thickness of the first dielectric layer stack. This has the advantage over the previous embodiments that the electric field can further be reduced, and that a larger manufacturing flexibility is available.

In all of the embodiments disclosed in relation with FIG. 2 to FIG. 5, the following relation can be applicable for the dielectric constants: $k1 \leq k23 < k4$.

Figure 6:
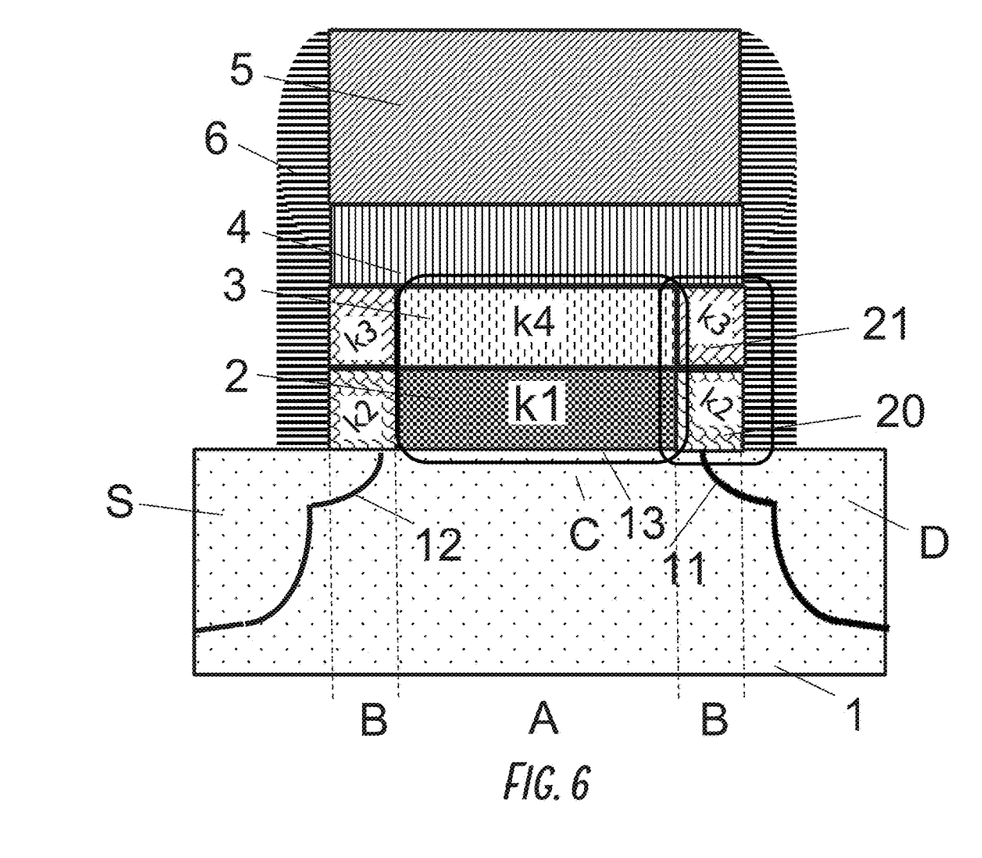
Figure 7:
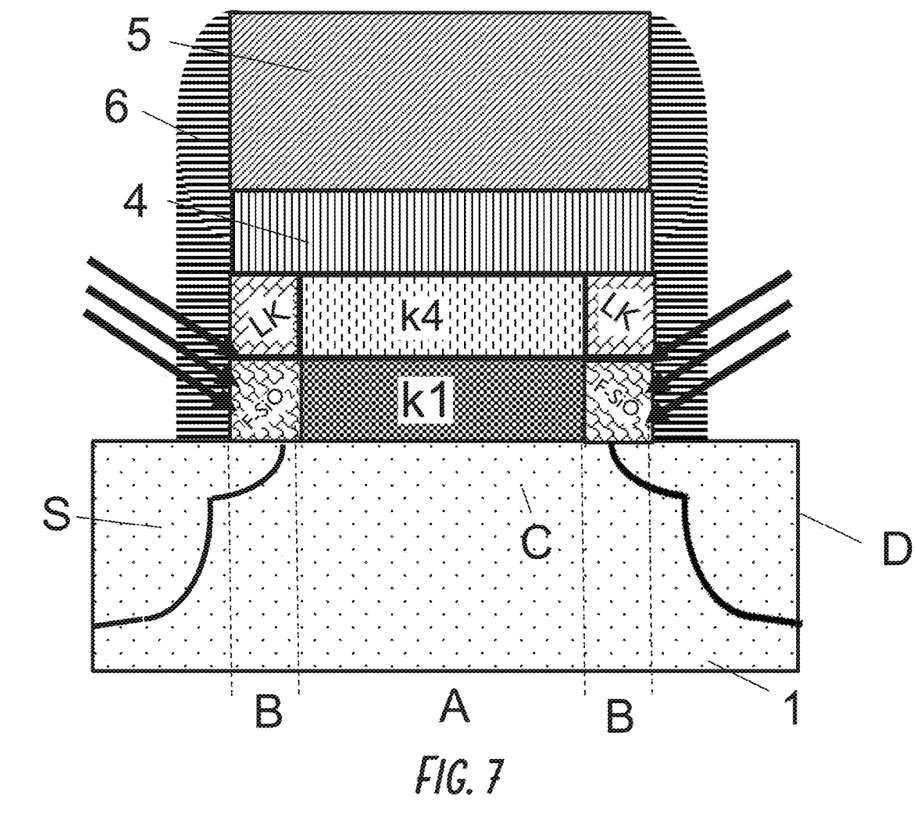

FIG. 6 illustrates a transistor device according to a fifth embodiment of the present disclosure, an embodiment of a second type. The embodiment is similar as the embodiments described before, of the first type described above with respect to FIGS. 2-5, except that the second dielectric layer stack comprises a first dielectric layer 20 on the main surface 13, and a second dielectric layer 21 on top of the first dielectric layer 20. In the embodiment depicted, the first dielectric layer 20 and the second dielectric layer 21 have a thickness which is equal or about equal to the thicknesses of the first and second dielectric layers 2,3 of the first dielectric layer stack. This may be advantageous as it may simplify the production process of the transistor device. Alternatively, the thicknesses of the first layer 20 and/or of the second layer 21 of the second dielectric layer stack can be different from the respective first layer 2 and second layer 3 of the first dielectric layer stack 2,3. The (i.e. combined) thickness of the second dielectric layer stack can be equal, about equal, smaller, or larger than the thickness of the first dielectric layer stack 2,3.

The first dielectric layer stack can thus for instance comprise a first layer 2 comprising a silicon oxide $SiO_x$ and/or $SiO_xN_y$ (including $SiO_2$ and $SiN_x$), and has a dielectric constant k1 and a second, high-k dielectric layer 3 having a dielectric constant k4 on the silicon oxide layer 2, with k4>k1. In preferred embodiments, illustrated in FIG. 7, the first layer of the second dielectric layer stack comprises the same material as the first layer of the first dielectric layer stack, and is thus equally thick; they can for instance be formed in a single, common process step. In the second area the layer can be modified in the second area, e.g. by implantation or in-diffusion of atoms (e.g. F-atoms), which reduces the k-value of the layer locally.

Figure 8:
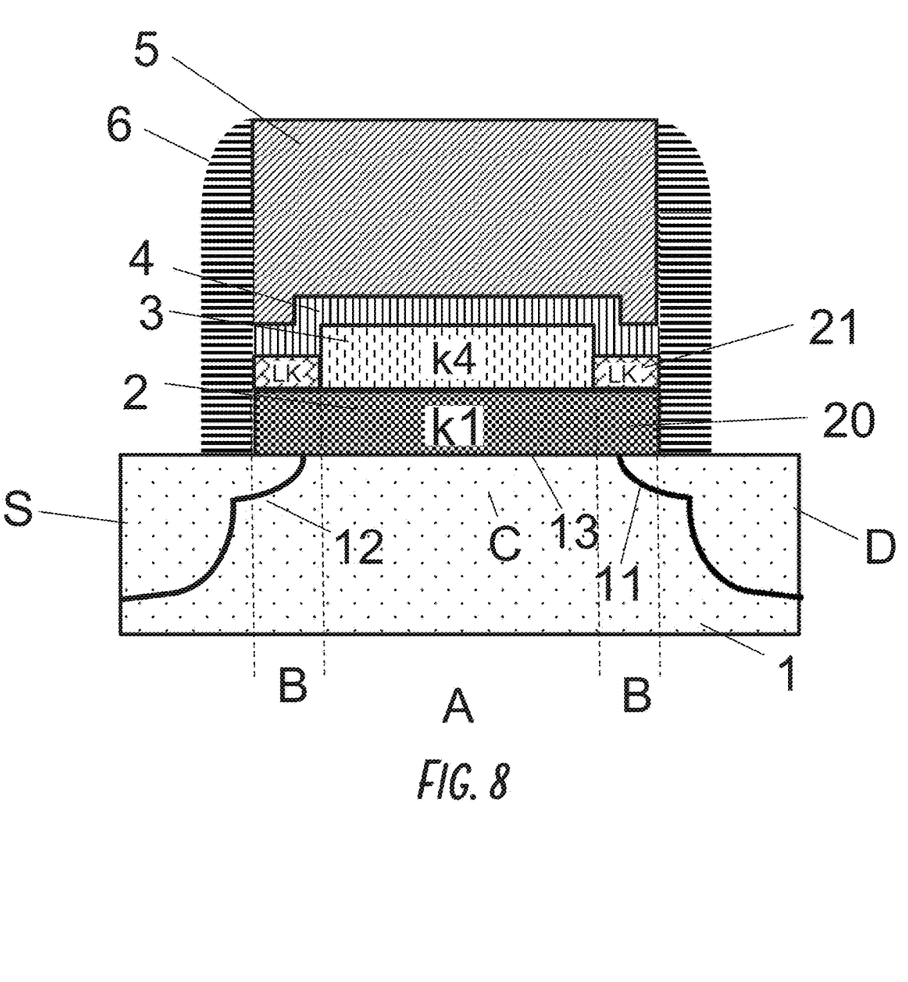

FIG. 8 illustrates a transistor device according to a seventh embodiment of the present disclosure. This embodiment is similar to the embodiment described above with respect to FIG. 6 and FIG. 7. The first layer 20 of the second dielectric layer stack is here the same as the first layer 2 of the first dielectric layer stack; for instance it can be formed in a single step, such that k1=k2. The second layer 21 of the second dielectric layer stack is thinner than the second layer of the first dielectric layer stack 3. The second dielectric layer stack is thus thinner than the first dielectric layer stack. The metal gate layer 4 is provided on the first dielectric layer stack 2,3 and the second dielectric layer stack 20, 21.

In all of the embodiments described above of the second type, the dielectric constants of the respective dielectric layers are preferably following any of the following relations, or any consistent combination thereof:

$k1 \geq k2$, and $k2 < k3 < k4$;

$k1 < k2 < k3 < k4$;

$k1 < k3 < k2 < k4$;

$k2 < k3$;

$k2 > k3$;

$k3 < k1$ (or $k3 < 3.9$ in case that the first dielectric layer of the first dielectric layer stack comprises $SiO_2$).

It is noted that in principle, the above embodiments, as well as the general concepts of the present disclosure, can be applied on at least one side of the channel region C i.e. in the area B above the drain junction 13 or in the area B above the source junction 12. In principle, any of the disclosed embodiments can be applied on the source junction 12 and any of the disclosed embodiments can be applied on the drain junction 13, wherein the second dielectric layer stack can be different above the source junction 12 and the drain junction 13. Preferably, the same second dielectric layer stack is provided laterally adjacent and in physical contact with the first dielectric layer stack 2,3, on both sides of the first dielectric layer stack, as illustrated in the different embodiments.

Figure 9:
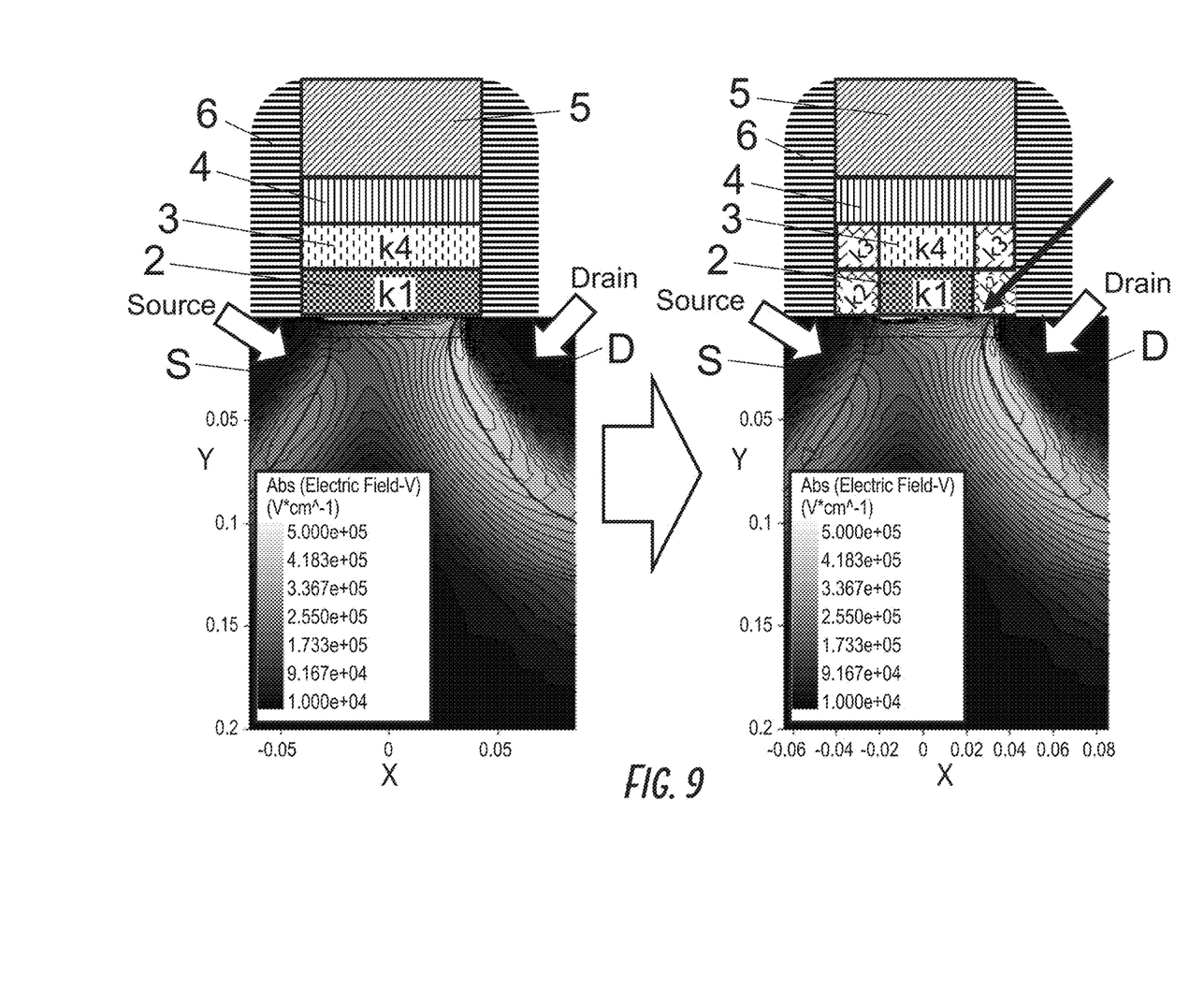
FIGS. 9 to 11 show simulation results indicating the effectiveness of embodiments of the present disclosure.
Figure 10:
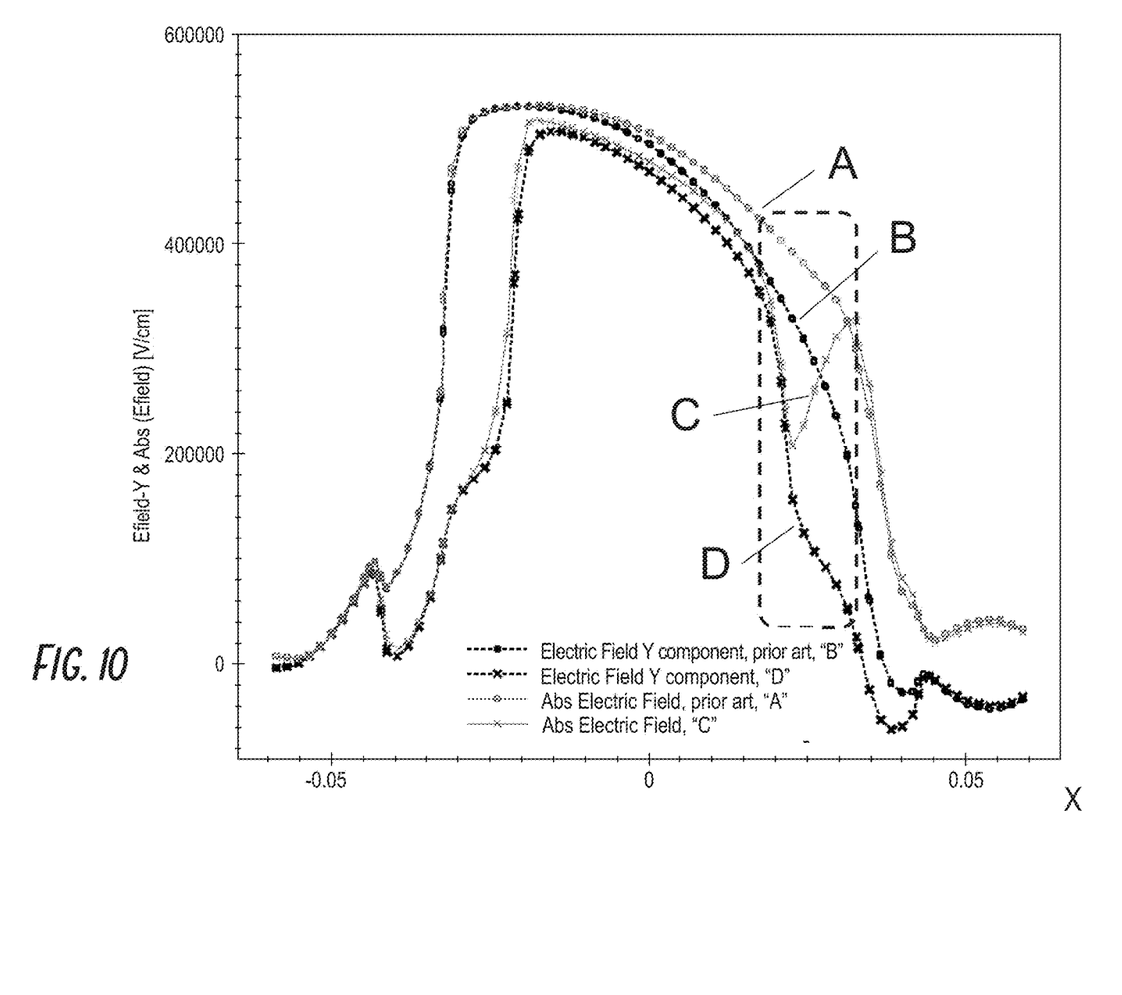
Figure 11:
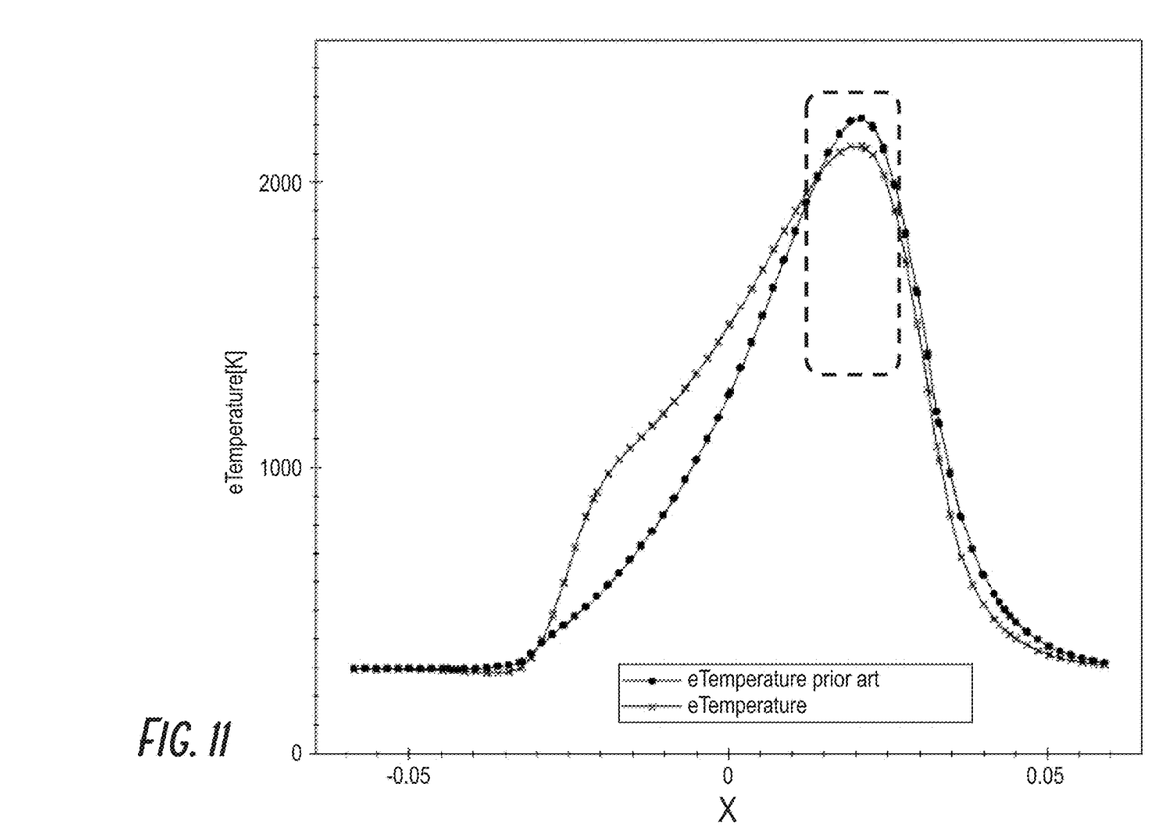

FIGS. 9 to 11 show simulation results indicating the effectiveness of the embodiments of the present disclosure.

An example of the effectiveness of the proposed solution according to embodiments of the present disclosure is shown in FIG. 9, which represents simulation results for an embodiment described in relation with FIG. 6. The results are believed to be similar for any of the other embodiments.

The left side shows the 2D graph with the Abs(Efield), absolute value of the electric field components SQRT $[(E\_X^2+E\_Y^2)]$, which includes the effect of both components of the electric field (horizontal and vertical), when the transistor is switched on (e.g.: Vs=0V, $V_G$>0V, $0<V_D<V_{DD}$ for an NMOS case). In this case, the equivalent oxide thickness was 5 nm and the conditions were $V_G$=1.5V, $V_D$=1V.

The graph on the right shows the 2D plot of same quantity, but for embodiments of the present disclosure. It is visible that in the region underneath the different dielectric constant (k2), the electric field is modified and reduced, in particular on the drain side.

Such an effect is evidenced also in FIG. 10, where the 1D plot of the Abs(Efield) along the channel direction (from source to drain) is shown. Comparing the state of the art solution with the embodiments of the present disclosure, it is clear that a reduction in the Efield is observed below the region with lower dielectric constant. This example shows the reduction of the Absolute value of the electric field (A: prior art; C: embodiments of the present disclosure), as well as one of for the Vertical Component (Y-component) of the Electric Field (B: prior art; D: embodiments of the present disclosure).

FIG. 11 shows the carrier temperature, in the same case of before, simulated with a hydrodynamic transport model. It is clear that a reduction of the temperature is observed, when the proposed solution according to embodiments of the present disclosure is used. This is particularly observed below the region with lower dielectric constant (circles: prior art; crosses: embodiments of the present disclosure). Such a temperature is directly related to the generation of hot carriers, responsible for the induced damage which is required to be reduced.

The foregoing description details certain embodiments of the disclosure. It will be appreciated, however, that no matter how detailed the foregoing appears in text, the disclosure may be practiced in many ways.

While the above detailed description has shown, described, and pointed out novel features of the invention as applied to various embodiments, it will be understood that various omissions, substitutions, and changes in the form and details of the device or process illustrated may be made by those skilled in the technology without departing from the disclosure.

What is claimed is:

1. A transistor device comprising
a channel region formed in a substrate between a source junction and a drain junction formed at a main surface of the substrate;
a first dielectric layer stack formed on the channel region, wherein a projection of the first dielectric layer stack on the substrate does not cover the source and drain junctions, the projection defining a first area;
a second dielectric layer stack laterally adjacent to and in contact with the first dielectric layer stack, wherein a projection of the second dielectric layer stack on the substrate defines a second area; and
a metal gate layer formed on the first and second dielectric layer stacks, wherein a projection of the metal gate layer on the substrate covers at least the first area and the second area,
wherein the first dielectric layer stack comprises a first layer and a second layer formed on the first layer, wherein the second layer has a higher dielectric constant relative to the first layer,
wherein the second dielectric layer stack comprises a material that is different from and has a higher dielectric constant relative to the first layer of the first dielectric layer stack, and
wherein the first dielectric layer stack has a larger capacitance than the second dielectric layer stack as measured between the metal gate layer and the channel region.

2. The transistor device according to claim 1, further comprising a spacer contacting a lateral side of the metal gate layer, wherein the second dielectric layer stack is laterally interposed between the first dielectric layer stack and the spacer.

3. The transistor device according to claim 2, wherein the first dielectric layer stack does not contact the spacer.

4. The transistor device according to claim 1, wherein each of the source junction and the drain junction are formed by a respective extension region of the source region and the drain region, wherein the respective extension region has a dopant concentration lower than dopant concentrations of a source region and a drain region.

5. The transistor device according to claim 1, wherein the first layer comprises a material formed of silicon oxide and/or silicon oxy-nitride and has a first dielectric constant (k1), and wherein the second layer comprises a high-k dielectric layer having a fourth dielectric constant (k4), wherein k4>k1.

6. The transistor device according to claim 5, wherein the second dielectric layer stack is formed of a single layer having a third dielectric constant (k23), wherein the second dielectric layer stack has a thickness which corresponds to a thickness of the first layer of the first dielectric layer stack.

7. The transistor device according to claim 5, wherein the second dielectric layer stack is formed of a single layer having a third dielectric constant (k23), wherein the second dielectric layer stack has a thickness which corresponds to a thickness of the first dielectric layer stack.

8. The transistor device according to claim 5, wherein the second dielectric layer stack is formed of a single layer having a third dielectric constant (k23), wherein the second dielectric layer stack has a thickness which is greater than a thickness of the first dielectric layer stack.

9. The transistor device according to claim 5, wherein the second dielectric layer stack is formed of a single layer having a third dielectric constant (k23), wherein the second dielectric layer stack has a thickness which is between a thickness of the first layer of the first dielectric layer stack and a thickness of the first dielectric layer stack.

10. The transistor device according to claim 5, wherein the second dielectric layer stack has a third dielectric constant (k23), wherein k1<=k23<k4.

11. The transistor device according to claim 5, wherein the second dielectric layer stack comprises a first dielectric layer having a second dielectric constant (k2) and a second dielectric layer having a third dielectric constant (k3) on top of the first dielectric layer.

12. The transistor device according to claim 11, wherein k1>k2, and k2<k3<k4.

13. The transistor device according to 12, wherein the first dielectric layer of the second dielectric layer stack comprises silicon oxide and/or silicon oxynitride.

14. The transistor device according to claim 11, wherein k1<k2<k3<k4.

15. The transistor device according to claim 11, wherein k1<k3<k2<k4.

16. The transistor device according to claim 11, wherein the first dielectric layer of the second dielectric layer stack comprises the same material as the material of the first layer of the first layer stack, while further comprising atoms of an atomic element such that k2<k1.

17. The transistor device according to claim 11, wherein the first dielectric layer of the second dielectric layer stack has a thickness equal to the first layer of the first dielectric layer stack, and wherein the second dielectric layer of the second dielectric layer stack has a thickness which is smaller than or equal to the thickness of the high-k layer of the first dielectric layer stack.

18. The transistor device according to claim 1, wherein the second dielectric layer stack is provided laterally adjacent to and in physical contact with the first dielectric layer stack, on both sides of the first dielectric layer stack.

19. The transistor device according to claim 1, wherein the metal gate contacts the second layer of the first dielectric layer stack and the second dielectric layer stack.

20. A transistor, comprising:
a substrate;
a source region and a drain region each having a heavily doped region and an extension region doped at a lower dopant concentration than the heavily doped region;

a channel region formed laterally between PN junctions formed by the extension region of the source region and the extension region of the drain region;

a primary gate dielectric stack comprising a high-k dielectric layer, the primary gate dielectric stack formed vertically on the channel region and laterally within the channel region such that the primary gate dielectric stack does not laterally overlap the extension regions of the source region and the drain region, wherein the primary gate dielectric stack comprises a first layer and a second layer formed on the first layer, wherein the second layer has a higher dielectric constant relative to the first layer;

secondary gate dielectric layers formed laterally adjacent each side of the primary gate dielectric stack, wherein the secondary gate dielectric layers comprise a material that is different from and has a higher dielectric constant relative to the first layer of the primary gate dielectric stack; and a metal gate formed on the primary gate dielectric stack and on the secondary gate dielectric layers.

21. The transistor according to claim 20, further comprising spacers contacting lateral sides of the metal gate layer, wherein each of the secondary dielectric layer is laterally interposed between the first dielectric layer stack and a respective spacer, and wherein the primary gate dielectric stack does not contact the spacer.

22. The transistor according to claim 20, wherein the primary dielectric stack comprises a first layer comprising silicon oxide and/or silicon oxy-nitride and having a first dielectric constant, and wherein the second layer comprises a high-k dielectric layer.

* * * * *